United States Patent
Murphy et al.

(10) Patent No.: US 10,790,817 B2
(45) Date of Patent: Sep. 29, 2020

(54) POWER SWITCH WITH BOOTSTRAP DRIVER FOR CONTINUOUS TIME OPERATION

(71) Applicant: Qorvo US, Inc., Greensboro, NC (US)

(72) Inventors: Michael J. Murphy, Statesville, NC (US); Michael R. Kay, Summerfield, NC (US); Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/409,294

(22) Filed: May 10, 2019

(65) Prior Publication Data

US 2020/0259490 A1    Aug. 13, 2020

Related U.S. Application Data

(60) Provisional application No. 62/802,934, filed on Feb. 8, 2019.

(51) Int. Cl.
| | |
|---|---|
| *H03K 17/687* | (2006.01) |
| *H03F 3/20* | (2006.01) |
| *H02M 3/07* | (2006.01) |

(52) U.S. Cl.
CPC ............ *H03K 17/687* (2013.01); *H03F 3/20* (2013.01); *H02M 3/07* (2013.01); *H03F 2200/451* (2013.01)

(58) Field of Classification Search
CPC ....... H03K 19/01735; H03K 19/01714; H03K 17/06; H03K 19/063
See application file for complete search history.

(56) References Cited

U.S. PATENT DOCUMENTS

| | | | | |
|---|---|---|---|---|
| 5,500,612 A | * | 3/1996 | Sauer | G11O 27/02 327/91 |
| 6,060,937 A | * | 5/2000 | Singer | H03K 17/063 327/390 |

(Continued)

OTHER PUBLICATIONS

Steensgard-Madsen, Jesper, "Bootstrapped Low-Voltage Analog Switches," International Symposium on Circuits and Systems, vol. 2, 1999, IEEE, 4 pages.

(Continued)

*Primary Examiner* — Thomas J. Hiltunen
(74) *Attorney, Agent, or Firm* — Withrow & Terranova, P.L.L.C.

(57) ABSTRACT

A power switch with a bootstrap driver for continuous time operation is disclosed. In an exemplary aspect, the power switch selectively connects power management circuitry to one or more power amplifier stages in a radio frequency (RF) front end. The bootstrap driver provides a constant gate to source voltage during an enabled state of the power switch such that a switching element can remain closed with near-constant closed switch resistance in the presence of varying signals (e.g., varying power signals) passing through the power switch. The bootstrap driver can use a variable clock frequency to quickly close the power switch and resistor-capacitor (RC) filtering to reduce noise contribution to the signal path through the power switch. In some examples, a constant voltage reference provides battery independent voltage control of the gate to source voltage of the power switch.

20 Claims, 13 Drawing Sheets

(56) References Cited

U.S. PATENT DOCUMENTS

| | | | | |
|---|---|---|---|---|
| 6,072,355 | A * | 6/2000 | Bledsoe | G11C 27/024 |
| | | | | 326/88 |
| 6,329,848 | B1 * | 12/2001 | Maes | G11C 27/024 |
| | | | | 327/534 |
| 6,400,209 | B1 * | 6/2002 | Matsuyama | G05F 1/565 |
| | | | | 327/534 |
| 7,521,983 | B2 * | 4/2009 | Ragone | G11C 5/145 |
| | | | | 327/427 |
| 8,664,979 | B2 * | 3/2014 | Doris | G11C 27/024 |
| | | | | 327/94 |
| 9,379,702 | B2 * | 6/2016 | Yang | H03K 17/6871 |
| 9,490,697 | B2 * | 11/2016 | Rolland | H03K 17/063 |
| 9,893,738 | B2 * | 2/2018 | Lee | H03M 1/08 |
| 2006/0049857 | A1 * | 3/2006 | Song | G11C 27/02 |
| | | | | 327/94 |
| 2009/0039924 | A1 * | 2/2009 | Zanchi | G11C 27/024 |
| | | | | 327/94 |
| 2017/0207694 | A1 * | 7/2017 | Strijker | H02J 7/0052 |

OTHER PUBLICATIONS

Razavi, Behzad, "The Bootstrapped Switch," IEEE Solid-State Circuits Magazine, Sep. 2015, pp. 12-15.

Saisundar, S., et al., "11-Bit 6.5MS/s SAR ADC for Wireless Applications," International Journal of Information and Electronics Engineering, vol. 2, Issue 6, Nov. 2012, IEEE, pp. 889-891.

* cited by examiner

POWER SWITCH WITH BOOTSTRAP DRIVER FOR CONTINUOUS TIME OPERATION

RELATED APPLICATIONS

This application claims the benefit of provisional patent application Ser. No. 62/802,934, filed Feb. 8, 2019, the disclosure of which is hereby incorporated herein by reference in its entirety.

FIELD OF THE DISCLOSURE

This application relates to power switching, such as for radio frequency (RF) circuits.

BACKGROUND

Power switches, including high power switches, are widely used in radio frequency (RF) front-ends of mobile devices, such as cellular telephones. In these mobile devices, RF transmission signals are generally amplified by one or more power amplifier stages before being emitted through an antenna. In order to increase power efficiency, the input power of the power amplifier stages is controlled by power management circuitry. A power switch can selectively connect the power management circuitry to one or more of the power amplifier stages. The power switch includes a semiconductor-based switching element (e.g., a transistor) which must operate over a wide voltage range (e.g., from a ground voltage to a battery voltage of the mobile device).

FIG. 1 illustrates a traditional parallel transistor power switch 10. The parallel transistor power switch 10 incorporates an N-type field effect transistor (NFET) 12 coupled in parallel with a P-type field effect transistor (PFET) 14. At lower input voltages near ground, the NFET 12 conducts, at medium voltages the PFET 12 and NFET 14 both conduct, and at higher voltages near a direct current (DC) source voltage, the PFET 12 conducts. When the switch is closed, the parallel transistor power switch 10 has a PFET 12 gate voltage Vdrv_p set to ground and an NFET 14 gate voltage Vdrv_n set to the DC source voltage.

However, with a varying input signal VIN (e.g., a varying power signal), the parallel transistor power switch 10 experiences a varying source to gate voltage at the PFET 12 and/or NFET 14. This leads to a highly variable closed switch resistance, which may be higher than desirable and lead to excessive power loss and modulated signal distortion.

SUMMARY

The present disclosure relates to a power switch with a bootstrap driver for continuous time operation. In an exemplary aspect, the power switch selectively connects power management circuitry to one or more power amplifier stages in a radio frequency (RF) front end. The bootstrap driver provides a constant gate to source voltage during an enabled state of the power switch such that a switching element can remain closed with near-constant closed switch resistance in the presence of varying signals (e.g., varying power signals) passing through the power switch. The bootstrap driver can use a variable clock frequency to quickly close the power switch and resistor-capacitor (RC) filtering to reduce noise contribution to the signal path through the power switch. In some examples, a constant voltage reference provides battery independent voltage control of the gate to source voltage of the power switch. In some examples, the power switch can be implemented differently, such as to selectively connect an antenna to transmitter or receiver circuitry.

An exemplary embodiment relates to a switch circuit. The switch circuit includes a switch transistor having a source coupled to a variable voltage input port and a drain coupled to an output port. The switch circuit further includes a switch driver coupled to the variable voltage input port and coupled to a gate of the switch transistor. The switch driver configured to: in an enabled state, close the switch transistor and maintain a gate to source voltage of the switch transistor equal to or above a target voltage; and in a disabled state, maintain the switch transistor open.

Another exemplary embodiment relates to an RF circuit. The RF circuit includes a switch transistor comprising a source terminal, a drain terminal, and a gate terminal. The RF circuit further includes an input port coupled to the source terminal and configured to receive a variable voltage signal and an output port coupled to the drain terminal. The RF circuit further includes a reference voltage generator circuit configured to provide a reference voltage and a switch driver coupled to the reference voltage generator circuit and the input port. The switch driver circuit is configured to: in an enabled state, enable the switch transistor by providing a gate voltage to the gate terminal based on the reference voltage and the variable voltage signal; and in a disabled state, disable the switch transistor.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 5A:
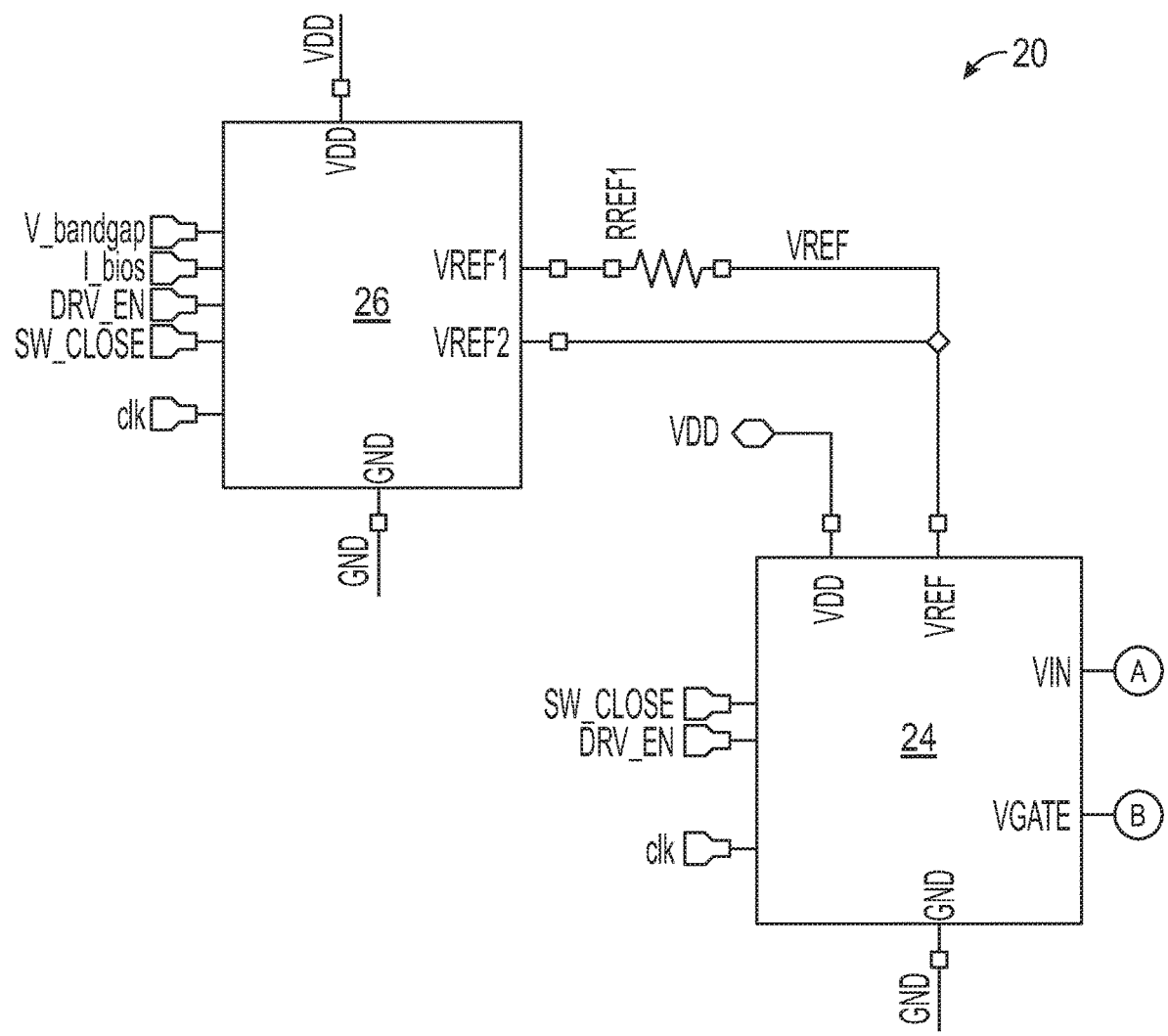
FIGS. 5A and 5B are a schematic diagram of a switch circuit for the power switch of FIG. 2.
Figure 5B:
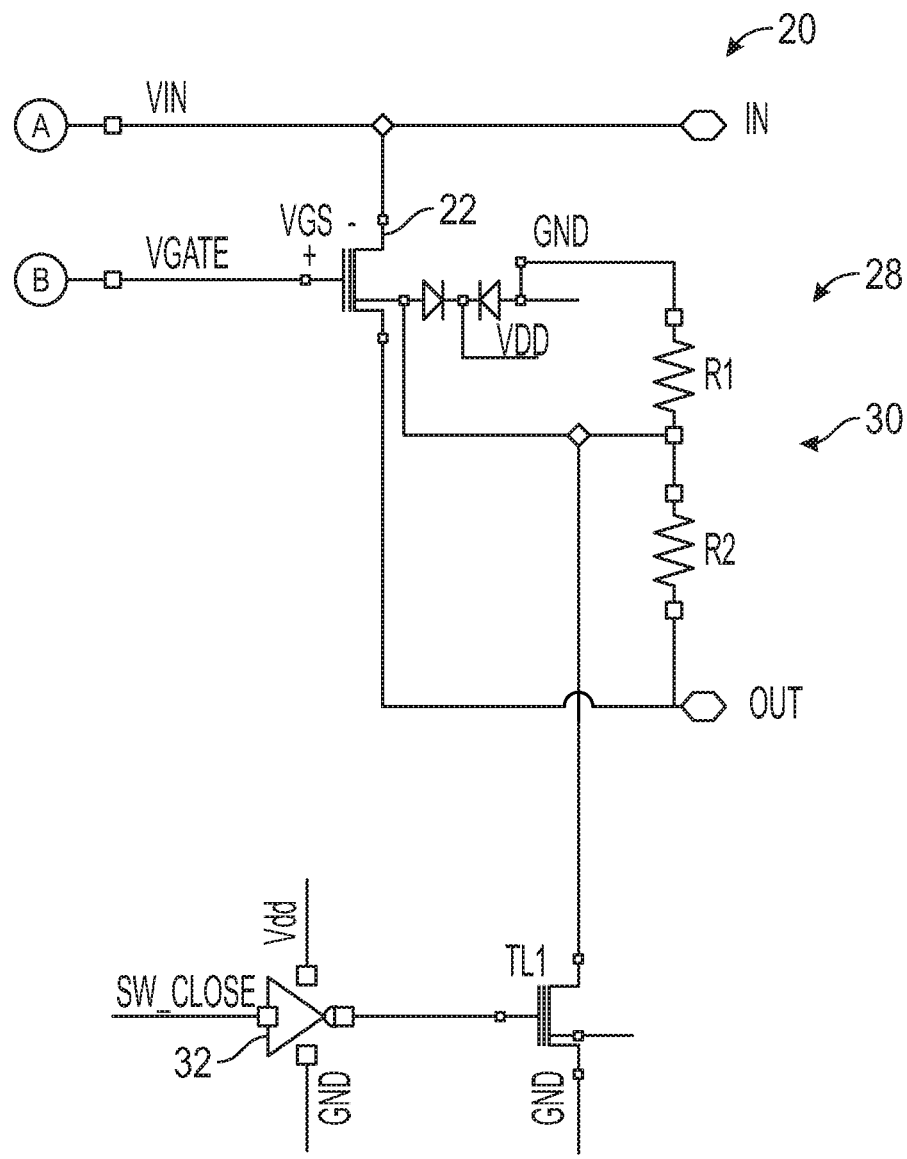
Figure 6A:
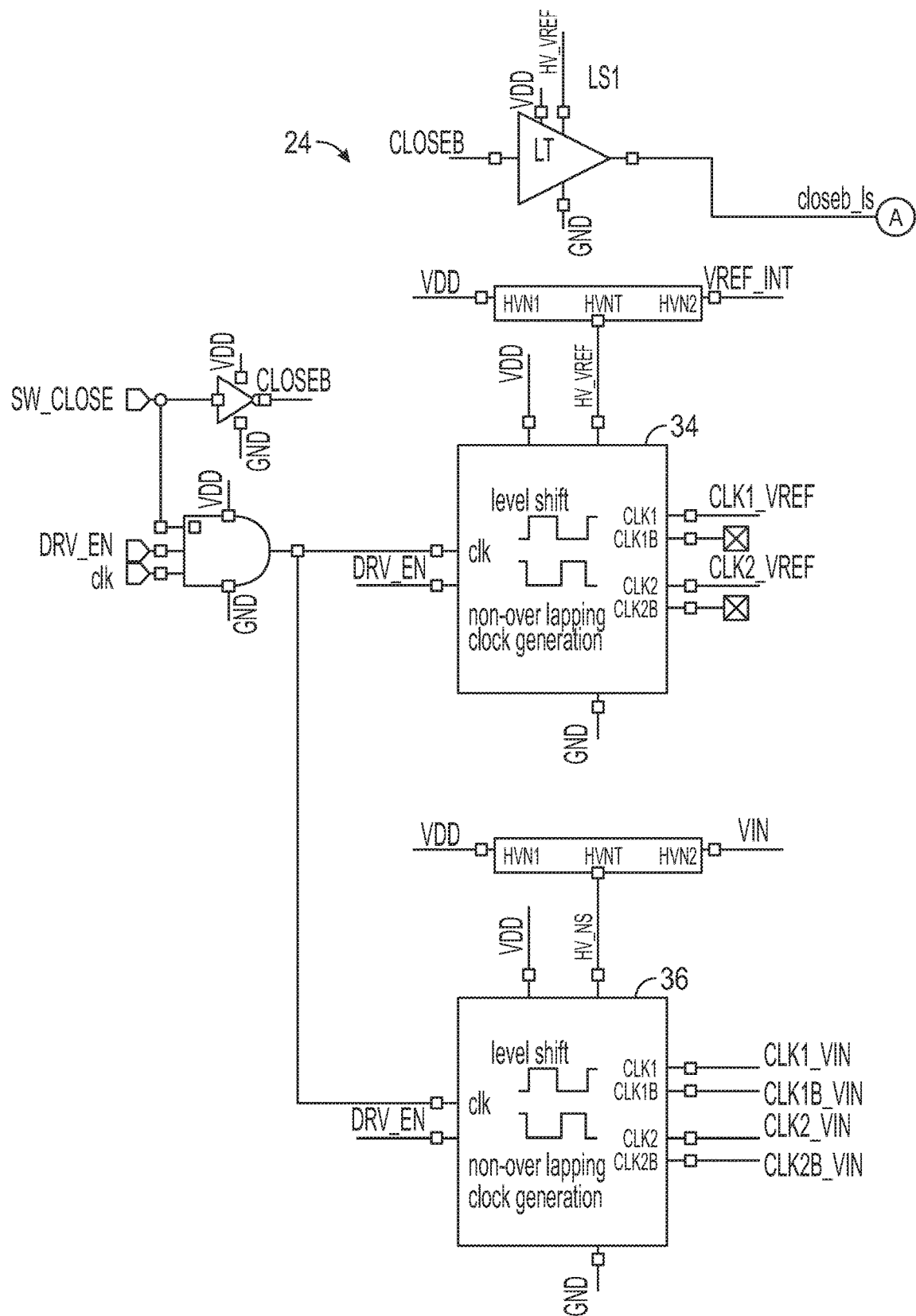
Figure 6B:
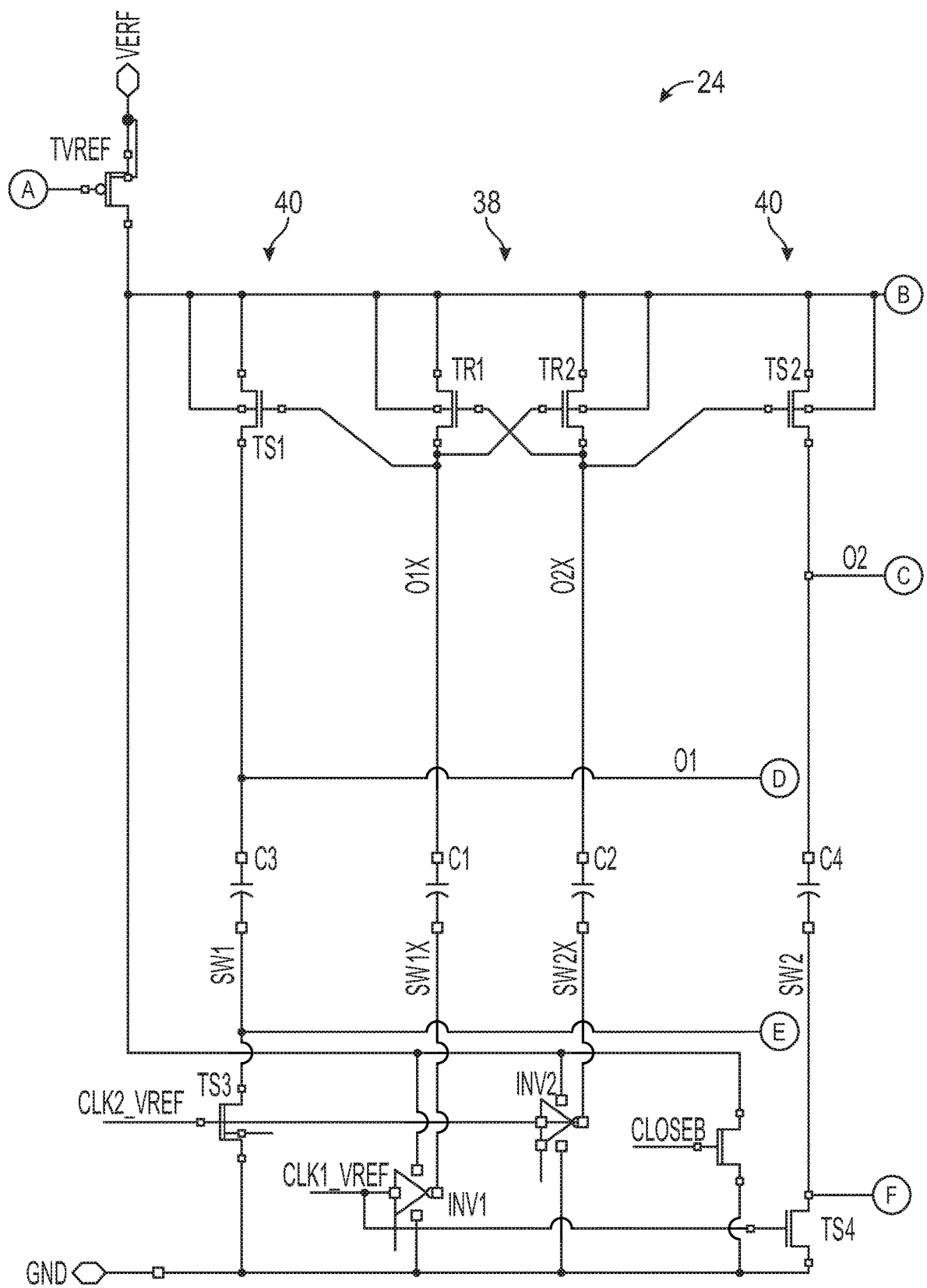
Figure 6C:
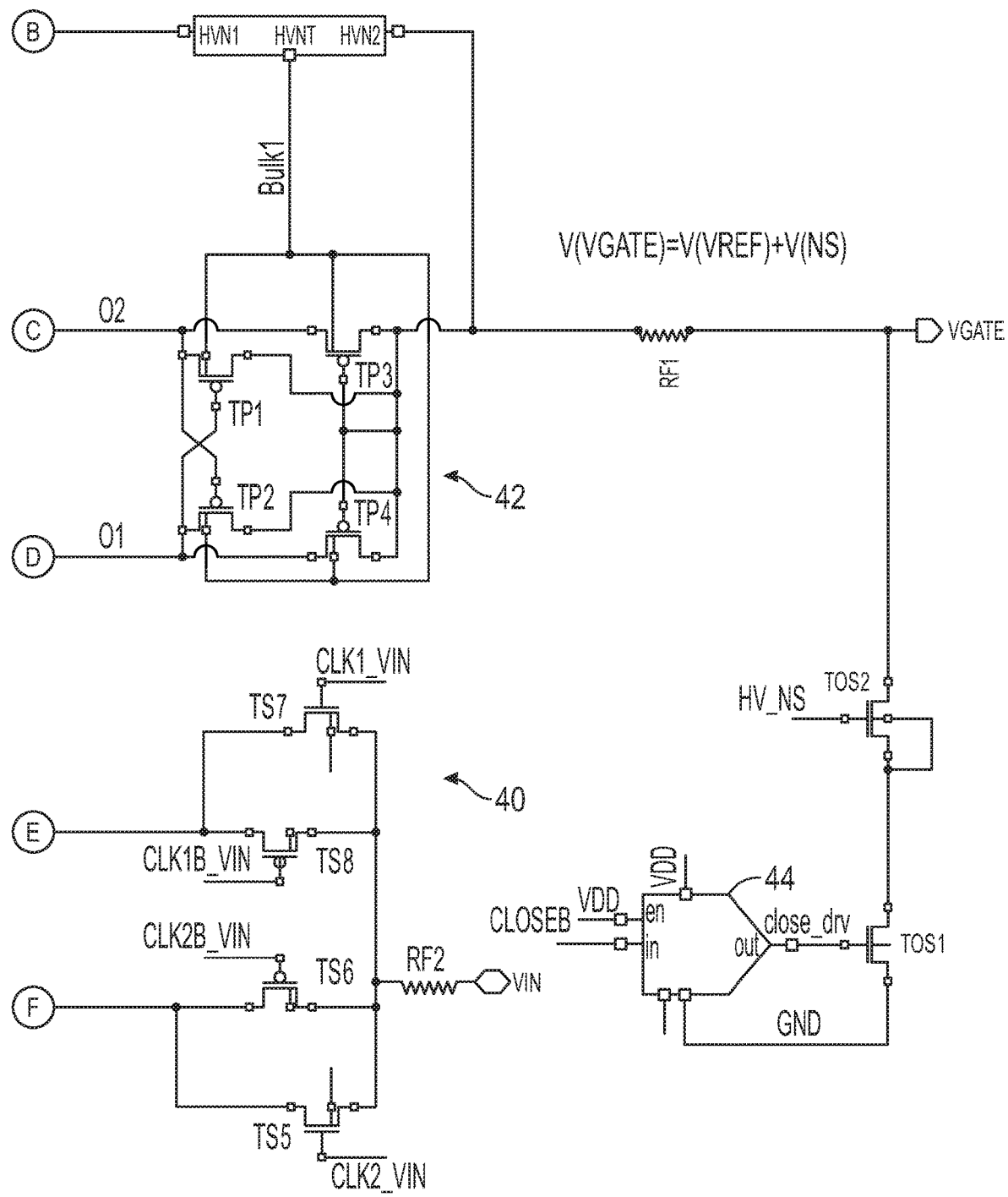
Figure 7A:
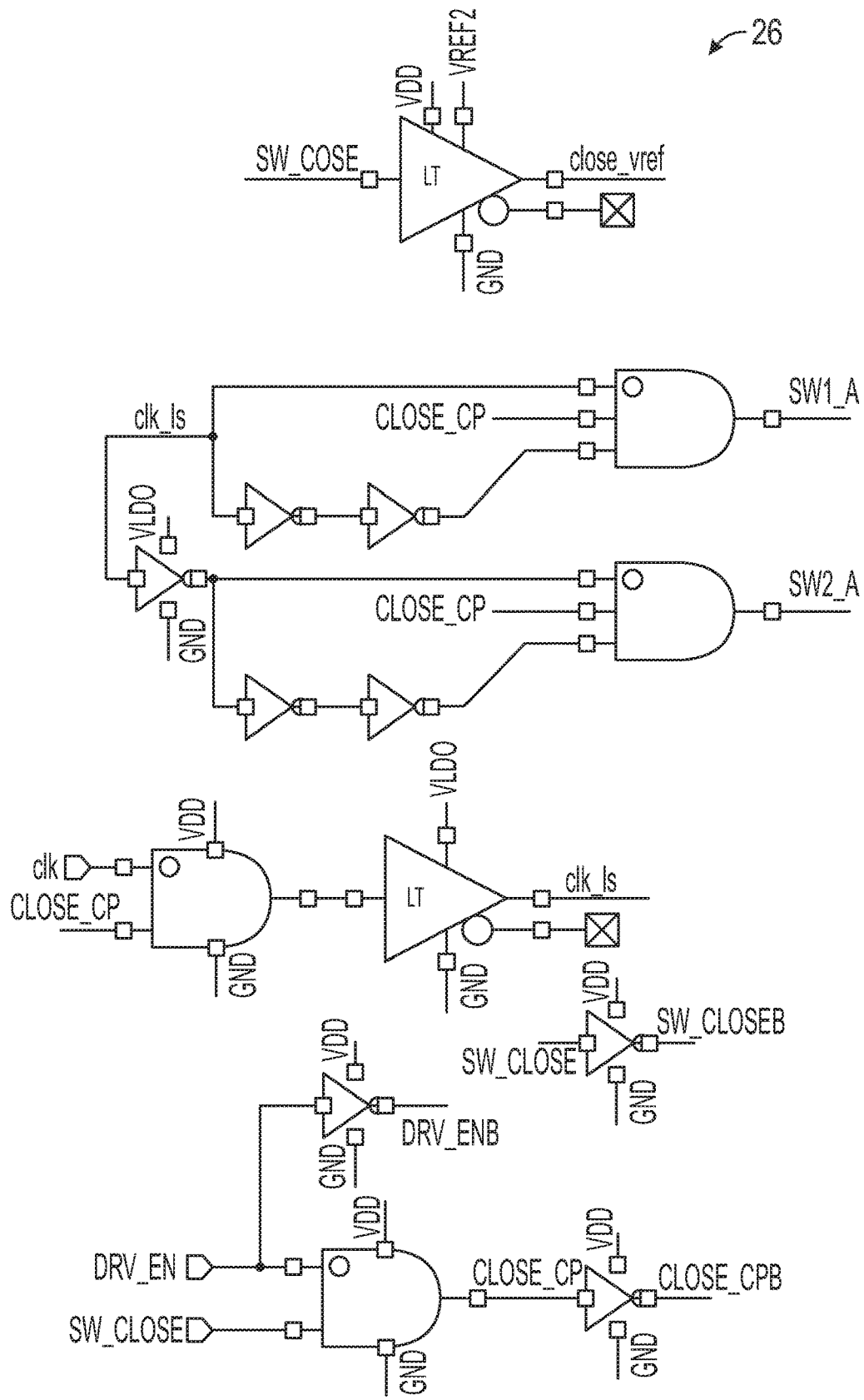
Figure 7B:
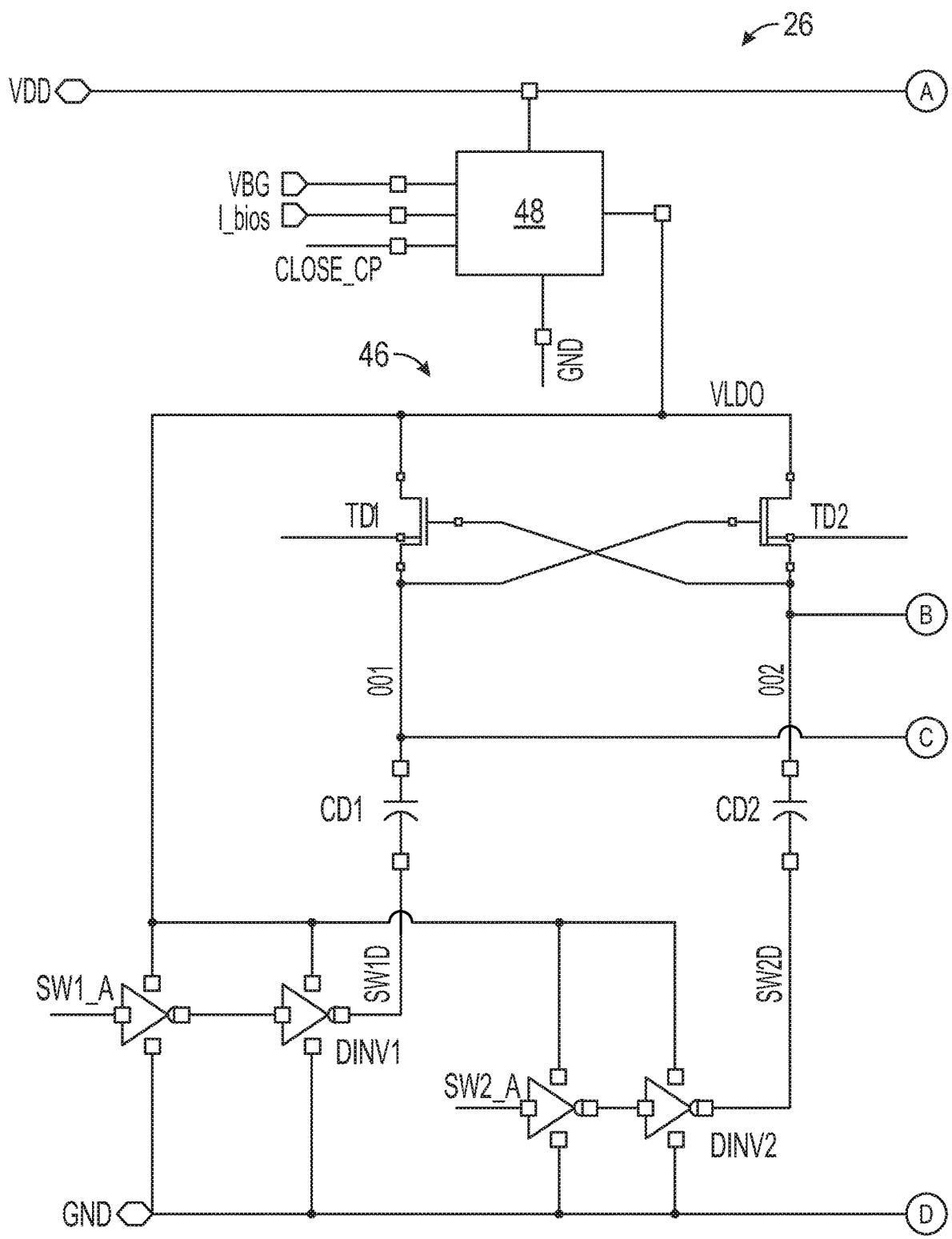
Figure 7C:
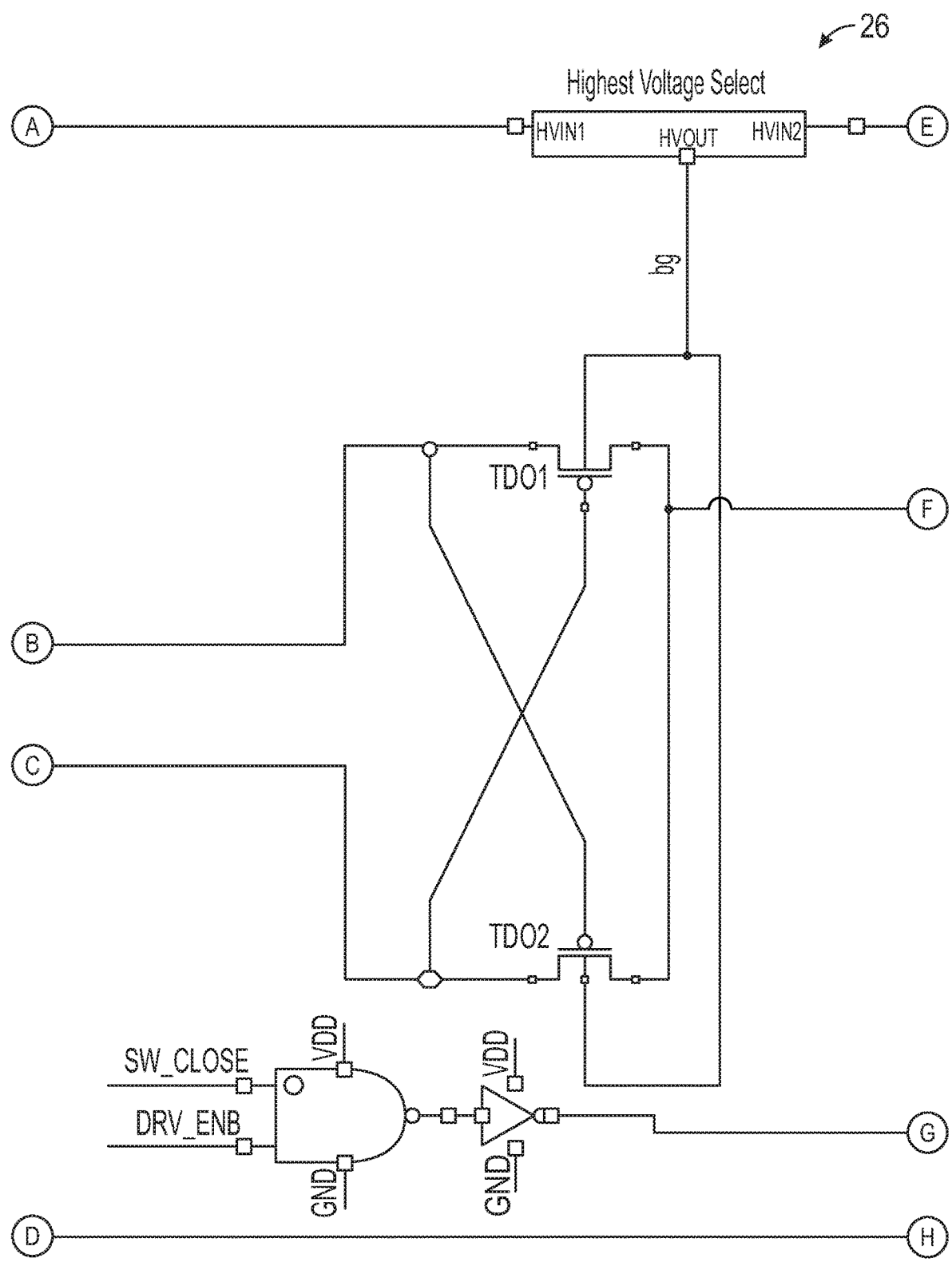
Figure 7D:
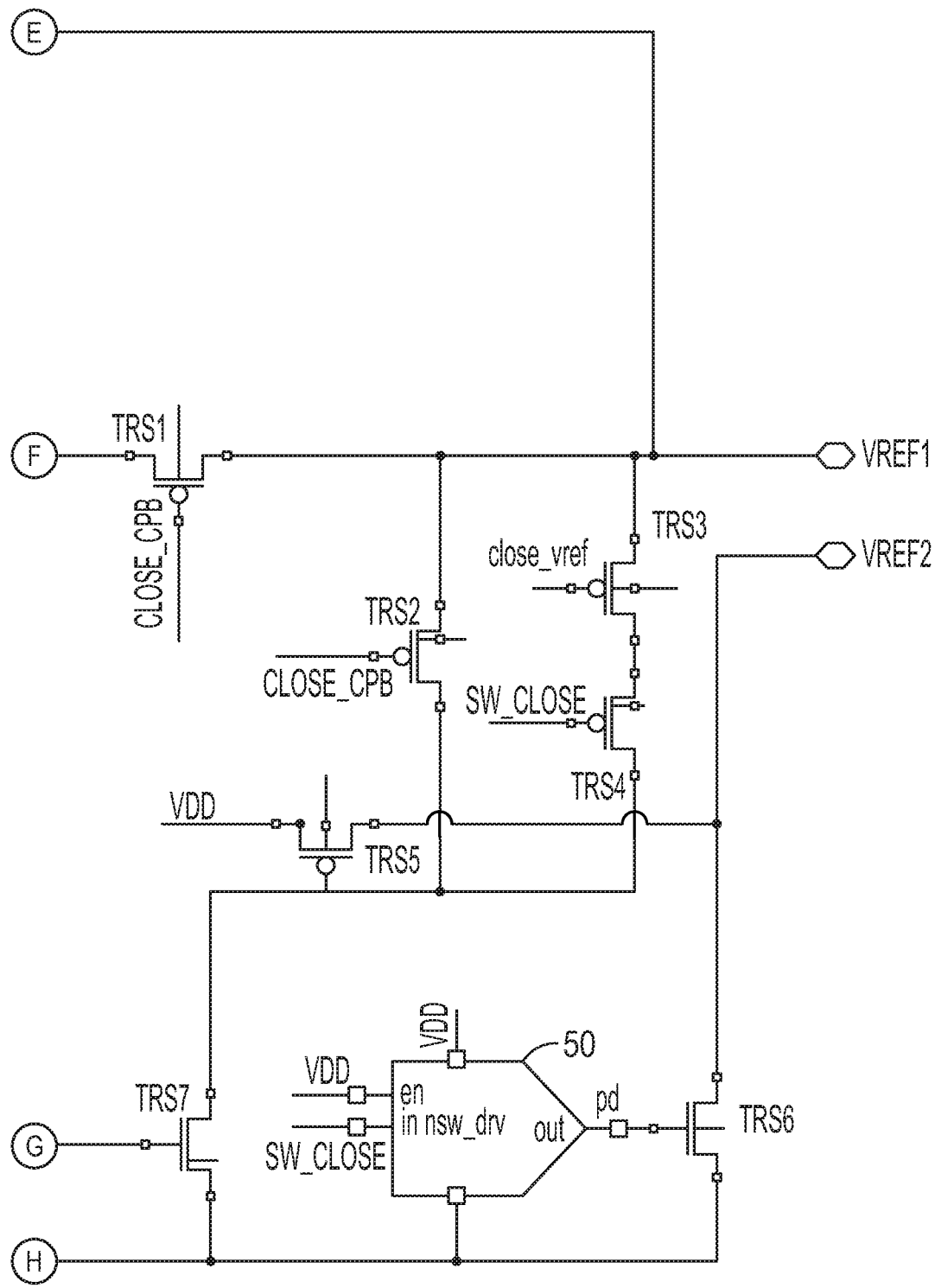

FIGS. 6A, 6B, and 6C are a schematic diagram of a switch driver for the switch circuit of FIGS. 5A and 5B.

FIGS. 7A, 7B, 7C, and 7D are a schematic diagram of a reference voltage generator circuit for the switch circuit of FIGS. 5A and 5B.

Figure 8:
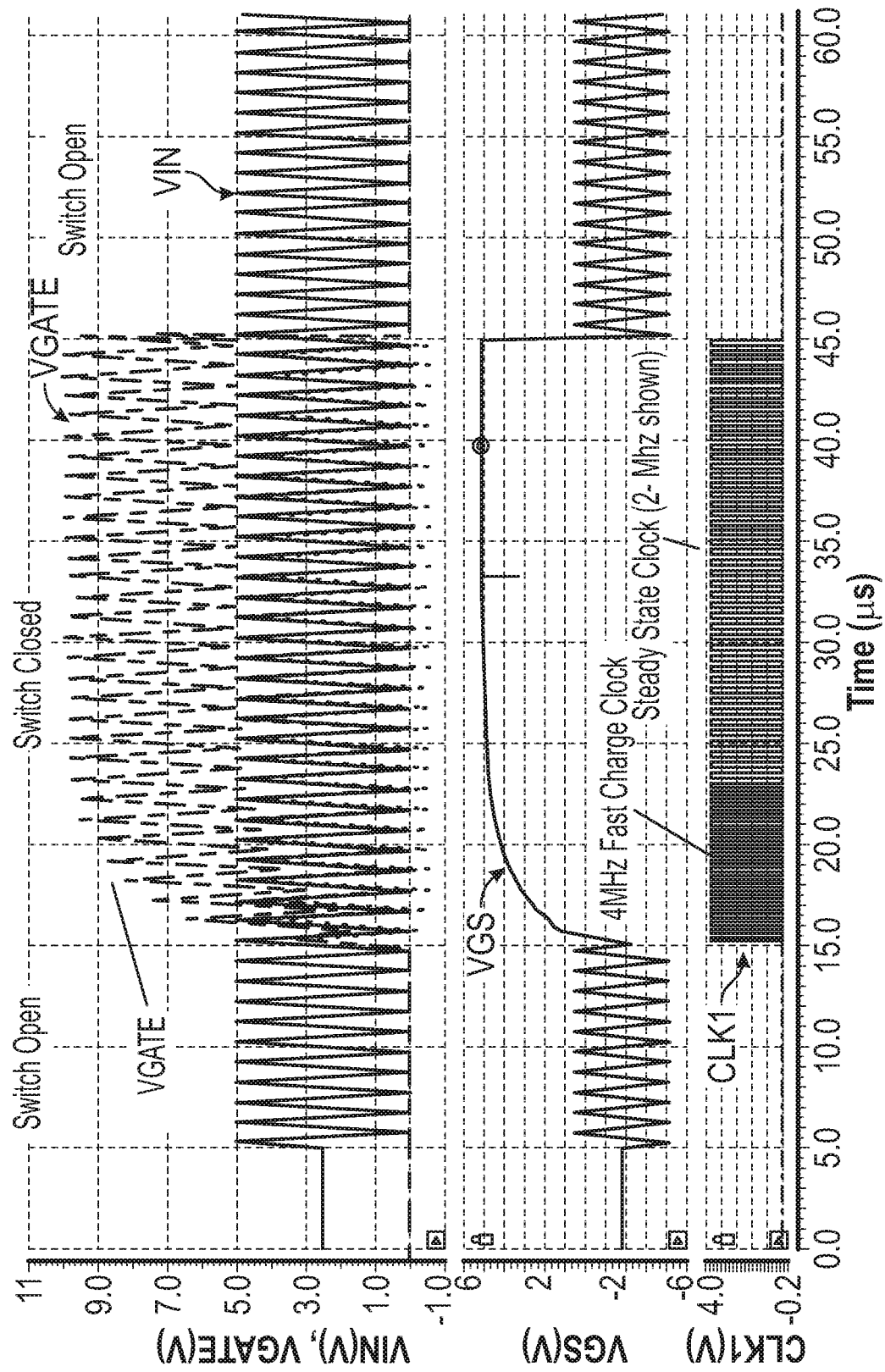

FIG. 8 is a graphical representation of operation of the switch circuit of FIGS. 5A and 5B.

In some cases, a schematic diagram comprises multiple figure sheets. In these cases, it should be understood that continuation bubbles denoted with letters connect components across the figure sheets. For example, continuation bubble A in FIG. 5A connects with the corresponding continuation bubble A in FIG. 5B.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a power switch with a bootstrap driver for continuous time operation. In an exemplary aspect, the power switch selectively connects power management circuitry to one or more power amplifier stages in a radio frequency (RF) front end. The bootstrap driver provides a constant gate to source voltage during an enabled state of the power switch such that a switching element can remain closed with near-constant closed switch resistance in the presence of varying signals (e.g., varying power signals) passing through the power switch. The bootstrap driver can use a variable clock frequency to quickly close the power switch and resistor-capacitor (RC) filtering to reduce noise contribution to the signal path through the power switch. In some examples, a constant voltage reference provides battery independent voltage control of the gate to source voltage of the power switch. In some examples, the power switch can be implemented differently, such as to selectively connect an antenna to transmitter or receiver circuitry.

Figure 2:
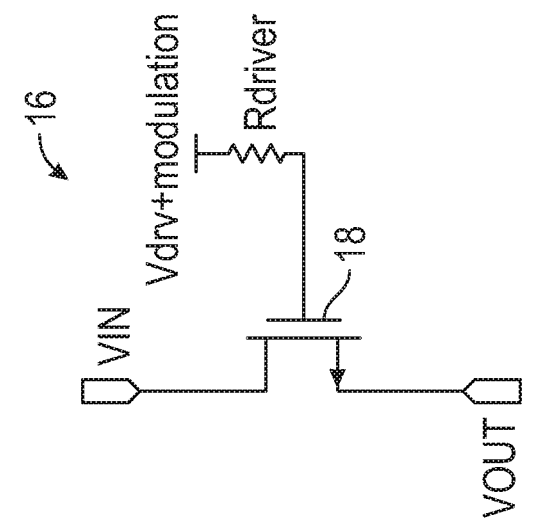
FIG. 2 illustrates a power switch with a single transistor according to exemplary embodiments.

FIG. 2 illustrates a power switch 16 with a single transistor according to exemplary embodiments. In aspects disclosed herein, the power switch 16 includes an N-type field effect transistor (NFET) 18 as a switching element. The power switch 16 boosts the gate voltage such that the NFET 18 can operate as a low resistance switch over a voltage range from a ground voltage to a direct current (DC) source voltage (e.g., a battery voltage). The NFET 18 is thus driven by a constant voltage above the input voltage VIN (for example, VIN+4 V). Under such conditions, the switch resistance for the power switch 16 is compared with the traditional parallel transistor power switch 10 of FIG. 1 in FIG. 3.

In an exemplary aspect, the power switch 16 selectively connects power management circuitry to one or more power amplifier stages in an RF front end. The power management circuitry may be configured for average power tracking (APT), envelope tracking, or another power management scheme. In such cases, the signal supplied to the power amplifier stages through the power switch 16 can be a varying DC voltage. In other examples, the power switch 16 connects other components, such as selectively connecting an antenna to transmitter or receiver circuitry. In these cases, a modulated RF signal can pass through the power switch 16.

Figure 1:
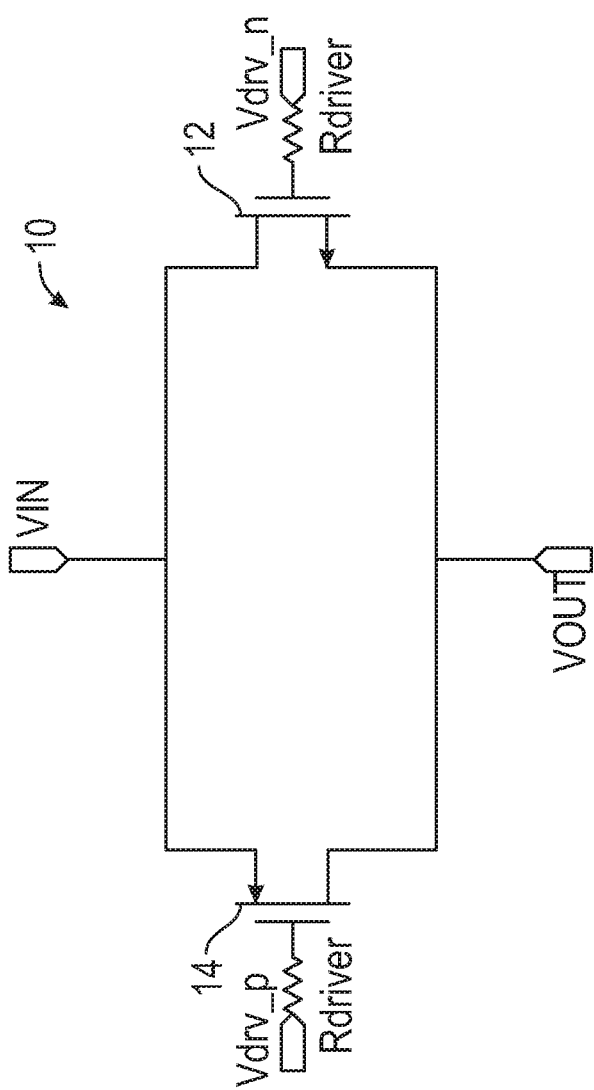
FIG. 1 illustrates a traditional parallel transistor power switch.
Figure 3:
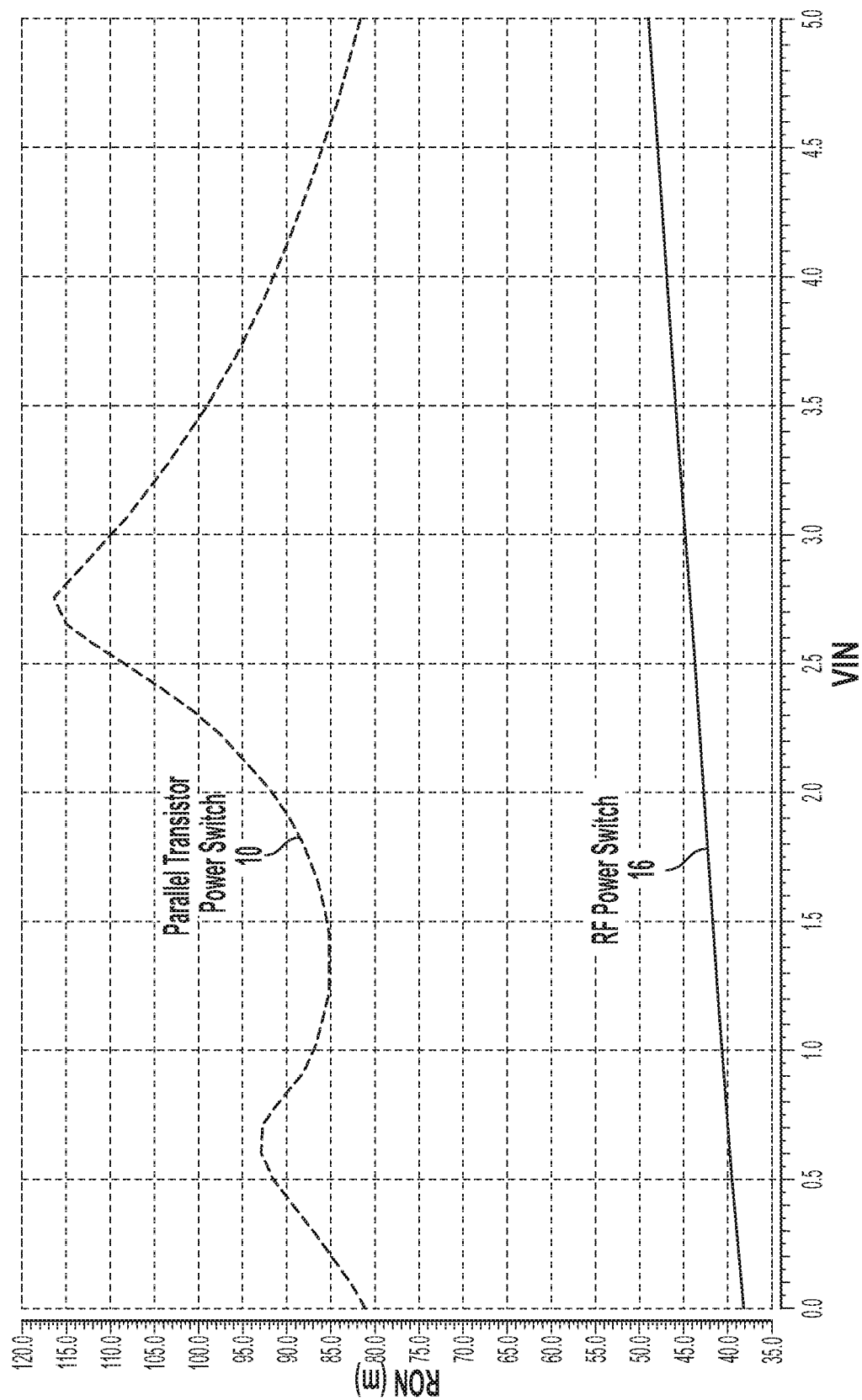
FIG. 3 is a graphical representation of closed switch resistance as a function of input voltage for the traditional parallel transistor power switch of FIG. 1 and the power switch of FIG. 2.

FIG. 3 is a graphical representation of closed switch resistance RON as a function of the input voltage VIN for the traditional parallel transistor power switch 10 of FIG. 1 and the power switch 16 of FIG. 2. The power switch 16 has several distinct advantages. First, the NFET 18 has lower resistance over the entire input voltage VIN range for less than half of the size of the parallel transistor power switch 10. This reduced area also accounts for a greater than 2× reduction in parasitic capacitance to the power switch 16, which is important to manage noise and undesired signal coupling. Second, the closed switch resistance RON of the NFET 18 has much less variation over the entire voltage range. Accordingly, exemplary embodiments incorporate the power switch 16 with a single NFET 18 with constant gate to source voltage of the NFET 18 to provide a low resistance path for varying DC and/or modulated RF signals over a wide input range.

Figure 4:
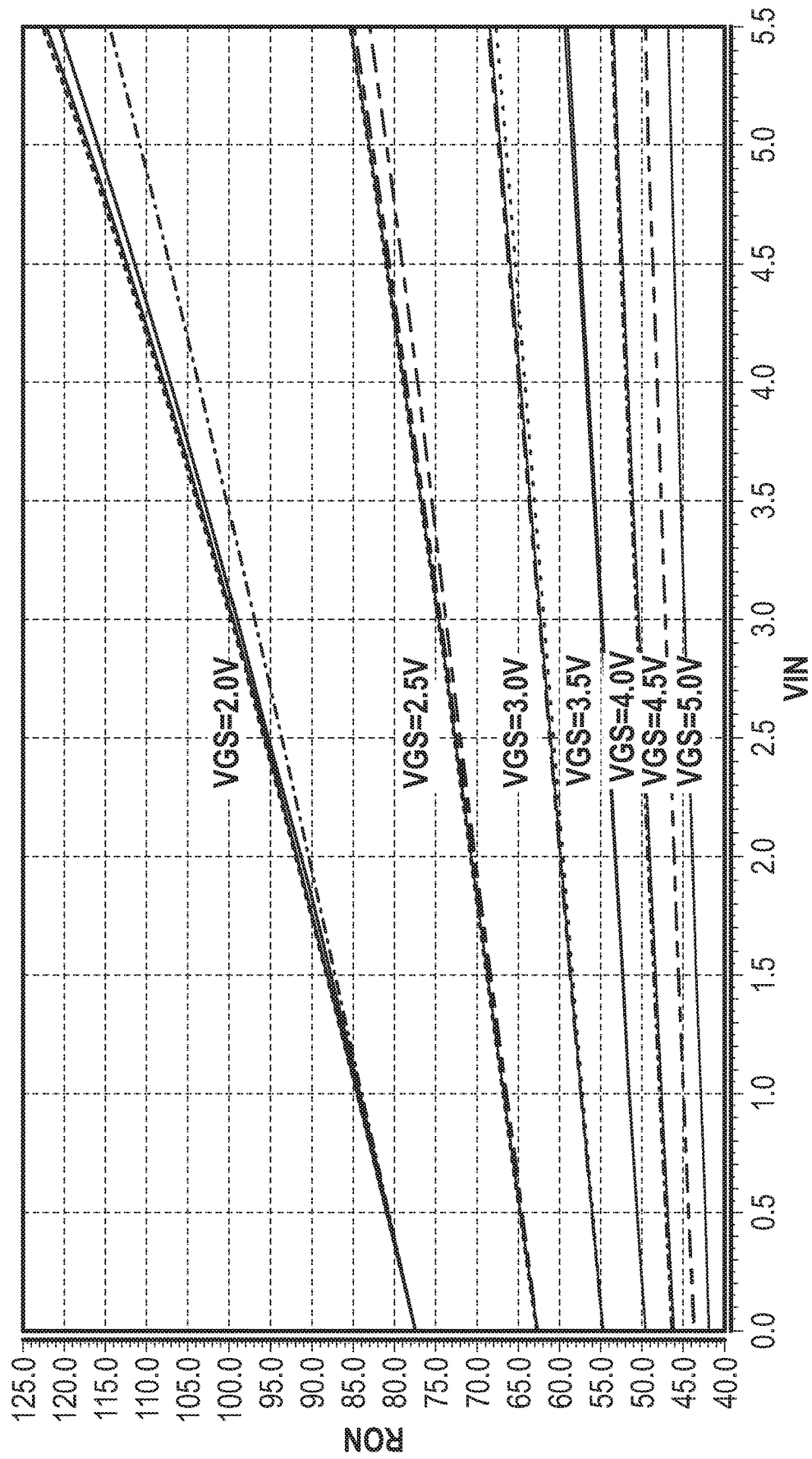
FIG. 4 is a graphical representation of closed switch resistance as a function of input voltage for the power switch of FIG. 2 at various gate to source voltages.

FIG. 4 is a graphical representation of the closed switch resistance RON as a function of the input voltage VIN for the power switch 16 of FIG. 2 at various gate to source voltages VGS. As shown in FIG. 4, a gate to source voltage VGS of 2.5 volts (V) or less is enough to support resistances of less than 100 milliohms (ms)) for a 40 millimeter (mm) NFET 18 over a 5.5 V range. However, gate to source voltages VGS of 4 V or greater reduce the switch resistance to less than 50 ms). Therefore, in an exemplary aspect, the power switch 16 can generate and maintain gate to source voltages VGS that are at least 4 V to realize lower closed switch resistances RON (e.g., below a threshold value) and better performance. In some examples, a reference voltage is provided to achieve a constant voltage independent of supply voltage (e.g., battery voltage, which can fluctuate).

FIGS. 5A and 5B are a schematic diagram of a switch circuit 20 for the power switch 16 of FIG. 2. The switch circuit 20 includes a switch transistor 22 coupled between an input port IN and an output port OUT (e.g., a source of the switch transistor 22 is coupled to the input port IN and a drain of the switch transistor 22 is coupled to the output port OUT). A switch driver 24 is coupled to a gate of the switch transistor 22. The switch driver 24 is operable in an enabled state and a disabled state. In the enabled state (DRV_EN=1 and SW_CLOSE=1), the switch driver 24 closes the switch transistor 22 and maintains a gate to source voltage VGS of the switch transistor 22 equal to or above a target voltage. In the disabled state, the switch transistor 22 is maintained open.

In greater detail, the input port IN receives a variable voltage signal (e.g., a varying DC power signal or a modulated RF signal). The switch circuit 20 can operate with an input voltage VIN which varies from 0 V up to the safe operating maximum voltage of the foundry process for the design (e.g., 5.5 V or 8.6 V). In an exemplary aspect, the switch driver 24 is coupled to the input port IN and a reference voltage VREF on which the target voltage is based. The switch driver 24 provides a gate voltage VGATE such that:

$$VGATE = VIN + VREF$$

in the enabled state, and $$VGATE = GND = 0V$$

in the disabled state. The switch driver 24 is discussed in further detail below with respect to FIGS. 6A, 6B, and 6C.

In an exemplary aspect, the switch transistor 22 comprises the NFET 18 of FIG. 2. In other examples, the switch transistor 22 instead comprises a P-type field effect transistor (PFET). In such examples, the gate voltage VGATE would be held to the input voltage VIN minus the reference voltage VREF in the enabled state (e.g., the gate to source voltage VGS would be held at a constant negative voltage), and pumped up to a voltage above the input voltage VIN in the disabled state. For illustrative purposes, the switch circuit 20 is described in FIGS. 5A-8 with respect to the switch transistor 22 comprising the NFET 18.

In another exemplary aspect, the switch driver 24 receives the reference voltage VREF from a reference voltage generator circuit 26. The reference voltage generator circuit 26 includes a charge pump coupled to a battery voltage VDD such that the reference voltage VREF remains greater than the target voltage over changes in a voltage of the battery voltage VDD. The reference voltage generator circuit 26 is discussed in further detail below with respect to FIGS. 7A, 7B, 7C, and 7D.

The switch circuit 20 also includes a body bias circuit 28 coupled to a body terminal of the switch transistor 22. The body bias circuit 28 includes a resistor divider network 30 with a first resistor R1 and a second resistor R2 coupled in series between the output port OUT and the ground voltage GND. The body bias circuit 28 biases the body terminal of the switch transistor 22 such that a gate to body voltage does not exceed safe operating voltage limits.

For example, the first resistor R1 and the second resistor R2 can each have a same resistance (e.g., 100 kilohms (kΩ)), such that the body terminal is biased at approximately one half the input voltage VIN of the variable voltage signal received at the input port IN. If the battery voltage VDD and the variable voltage signal each have a maximum voltage of 5 V, the body bias circuit 28 maintains the gate to body voltage below a safety threshold of 7.5 V. That is, the highest gate voltage VGATE would be 5 V (input voltage VIN)+5 V (reference voltage VREF)=10 V. In this case, the body bias circuit 28 provides a body voltage of ½ 5 V (signal at the output port OUT)=2.5 V, yielding a maximum gate to body voltage of 7.5 V.

In another exemplary aspect, the body bias circuit 28 includes a leakage transistor TL1, which is used to short the body terminal to the ground voltage GND when the switch transistor 22 is open so that there is no leakage through the bulk of the switch transistor 22. In this regard, a gate of the leakage transistor TL1 is coupled to an inverter 32, which is coupled to a switch close signal CLOSE (e.g., used to control the enabled state of the switch driver 24). Thus, the leakage transistor TL1 will be closed when the switch transistor 22 is open, and vice versa.

FIGS. 6A, 6B, and 6C are a schematic diagram of the switch driver 24 for the switch circuit 20 of FIGS. 5A and 5B. The switch driver 24 generates the gate voltage VGATE from the input voltage VIN and the reference voltage VREF. The switch driver 24 uses non-overlapping clock circuits 34, 36 to generate two clock phases, CLK1 and CLK2. A first clock circuit 34 generates clock signals CLK1_VREF and CLK2_VREF that are level shifted to the highest voltage of the reference voltage VREF or the battery voltage VDD. A second clock circuit 36 generates clock signals CLK1_VIN, CLK1B_VIN, CLK2_VIN, and CLK2B_VIN that are level shifted to the highest voltage of the battery voltage VDD or the input voltage VIN.

A reference voltage multiplier circuit 38 is formed with a first reference transistor TR1, a second reference transistor TR2, a first inverter INV1, and a second inverter INV2. A first capacitor C1 is coupled between the first reference transistor TR1 and the first inverter INV1, and a second capacitor C2 is coupled between the second reference transistor TR2 and the second inverter INV2. In an exemplary aspect, the first reference transistor TR1 and the second reference transistor TR2 are each NFETs.

At startup of the reference voltage multiplier circuit 38, a first reference switching node SW1X (between the first capacitor C1 and the first inverter INV1) is forced to the ground voltage GND by the first inverter INV1, and a second reference switching node SW2X (between the second capacitor C2 and the second inverter INV2) is forced to the reference voltage VREF by the second inverter INV2 during a phase of the first clock CLK1. Initially, the first capacitor C1 and the second capacitor C2 have no charge across the terminals such that voltage at a first reference output node O1X (between the first capacitor C1 and the first reference transistor TR1) is at the ground voltage GND, and voltage at a second reference output node O2X (between the second capacitor C2 and the second reference transistor TR2) is boosted to the reference voltage VREF. However, the gate of the first reference transistor TR1 is connected to the second reference output node O2X, so the first capacitor C1 quickly charges to a voltage slightly less than the reference voltage VREF.

During a subsequent phase of the second clock CLK2, the first reference switching node SW1X is forced to the reference voltage VREF by the first inverter INV1, and the second reference switching node SW2X is forced to the ground voltage GND by the second inverter INV2. The first reference output node O1X is boosted to the reference voltage VREF plus the voltage stored on the first capacitor C1 for the previous charge. The second capacitor C2 is then charged in a similar fashion as the first capacitor C1 in the previous stage.

After the reference voltage multiplier circuit 38 reaches steady state operation, the following node voltages apply during each respective clock phase:

During the CLK1 phase operation:
SW=VREF
SW2X=GND

O1X=VREF
O2X=2×VREF
During the CLK2 phase operation:
SW1X=GND
SW2X=VREF
O1X=2×VREF
O2X=VREF A signal dependent voltage multiplier circuit 40 is formed with a first signal transistor TS1, a second signal transistor TS2, a third signal transistor TS3, a fourth signal transistor TS4, a fifth signal transistor TS5, a sixth signal transistor TS6, a seventh signal transistor TS7, and an eighth signal transistor TS8. A third capacitor C3 is coupled between the first signal transistor TS1 and the third signal transistor TS3, and a fourth capacitor C4 is coupled between the second signal transistor TS2 and the fourth signal transistor TS4. The signal dependent voltage multiplier circuit 40 toggles a first signal output node O1 and a second signal output node O2 between the reference voltage VREF and the reference voltage VREF plus the input voltage VIN. In an exemplary aspect, the first signal transistor TS1, the second signal transistor TS2, the third signal transistor TS3, the fourth signal transistor TS4, the fifth signal transistor TS5, and the seventh signal transistor TS7 are each NFETs. The sixth signal transistor TS6 and the eighth signal transistor TS8 are each PFETs.

A first signal switching node SW1 (between the third capacitor C3 and the third signal transistor TS3) is toggled between the ground voltage GND via the third signal transistor TS3 and the input voltage VIN via the seventh signal transistor TS7 and the eighth signal transistor TS8 during the same phase as the second reference switching node SW2X of the reference voltage multiplier circuit 38. A second signal switching node SW2 (between the fourth capacitor C4 and the fourth signal transistor TS4) is toggled between the ground voltage GND via the fourth signal transistor TS4 and the input voltage VIN via the fifth signal transistor TS5 and the sixth signal transistor TS6 during the same phase as the second reference switching node SW2X of the reference voltage multiplier circuit 38.

The gates of the first signal transistor TS1 and the second signal transistor TS2 of the signal dependent voltage multiplier circuit 40 are driven by the outputs of the reference voltage multiplier circuit 38. That is, the gate of the first signal transistor TS1 is coupled to the first reference output node O1X, and the gate of the second signal transistor TS2 is coupled to the second reference output node O2X. This ensures that the gates of the first signal transistor TS1 and the second signal transistor TS2 will always be sufficiency boosted to charge the third capacitor C3 and the fourth capacitor C4 regardless of the input voltage VIN. If the first signal transistor TS1 and the second signal transistor TS2 were cross-coupled, then no switching would occur when VIN=0 as the bottom plate of both capacitors would remain static, and neither the first signal transistor TS1 nor the second signal transistor TS2 would turn on to charge the third capacitor C3 and the fourth capacitor C4 to the reference voltage VREF.

During steady state operation, the following node voltages apply during each clock phase:
During the CLK1 phase operation:
SW1=GND
SW2=VIN
O1=VREF
O2=VREF+VIN
During the CLK2 phase operation:
SW1=VIN
SW2=GND
O1=VREF+VIN
O2=VREF An output transistor circuit 42 is formed with cross-coupled PFETs first output transistor TP1 and second output transistor TP2, as well as a third output transistor TP3 and a fourth output transistor TP4. The output transistor circuit 42 is used to propagate the first signal output node O1 and the second signal output node O2 to the gate voltage VGATE output. In some examples, the output transistor circuit 42 is coupled to the gate voltage VGATE output through a first filter resistor RF1. During the phase of the first clock CLK1, the gate voltage of the second output transistor TP2 is at the voltage of the first signal output node O1=VREF and the drain voltage is O1=VREF+VIN. For the input voltage VIN>1 V, the second output transistor TP2 is on and the gate voltage VGATE=O1.

However, if the input voltage VIN<1 V, the second output transistor TP2 does not turn on (e.g., due to insufficient source to gate voltage) and the gate voltage VGATE does not charge to the voltage of the first signal output node O1. In order to allow the gate voltage VGATE to charge in such a situation, the third output transistor TP3 and the fourth output transistor TP4 are diode connected to ensure that the gate voltage VGATE is charged to at least a diode voltage below the voltage of the first signal output node O1 when the input voltage VIN is close to the ground voltage GND and the second output transistor TP2 cannot switch. The same operation occurs at the second clock CLK2 phase, but the first output transistor TP1 and the diode-connected third output transistor TP3 are used to connect the second signal output node O2 to the gate voltage VGATE output.

A reference voltage transistor TVREF (e.g., a PFET) is used to disconnect from the reference voltage VREF when the switch driver 24 is off. A first output shorting transistor TOS1 is used to short the gate voltage VGATE to the ground voltage GND when the switch driver 24 is off. A second output shorting transistor TOS2 is used to ensure the drain to source voltage of the first output shorting transistor TOS1 does not exceed safe operating voltages when the gate voltage VGATE is boosted to above maximum operating voltage of a single device. The second output shorting transistor TOS2 is driven by an output protection circuit 44.

The first filter resistor RF1 is used, along with the gate capacitance of the switch transistor 22, to filter out clock transients that would otherwise propagate to the signal path and generate noise on the gate voltage VGATE. A second filter resistor RF2 coupled to the input voltage VIN provides similar noise attenuation on the input voltage VIN node.

FIGS. 7A, 7B, 7C, and 7D are a schematic diagram of the reference voltage generator circuit 26 for the switch circuit 20 of FIGS. 5A and 5B. The reference voltage generator circuit 26 is a low dropout (LDO) regulated voltage multiplier to output a first reference voltage VREF1 of VREF1=2×VLDO when the switch close signal is active (SW_CLOSE=1) and the switch driver 24 is enabled (DRV_EN=1). The output of the reference voltage generator circuit 26 can also be shorted to the battery voltage VDD (e.g., when DRV_EN=0) or the ground voltage GND (e.g., when SW_CLOSE=0). A voltage doubler circuit 46 includes a first doubler transistor TD1 and a second doubler transistor TD2 (which may be NFETs), along with a first doubler inverter DINV1 and a second doubler inverter DINV2. A cross-coupled first doubler output transistor TDO1 and second doubler output transistor TDO2 (which may be PFETs) are used to connect the doubled voltage of either a first doubler output node OD1 or a second doubler output node OD2 to the first reference voltage VREF1 depending on the clock phase of the reference voltage generator circuit 26.

An LDO circuit 48 is designed to regulate the voltage doubler circuit 46 such that the first reference voltage VREF1 is at the maximum voltage possible for the process. For example, in a 5V process, the output VLDO of the LDO circuit 48 would be 2.5 V to generate the maximum possible voltage of 5 V at the output.

The voltage reference circuit 26 has two output signals, the first reference voltage VREF1 and a second reference voltage VREF2. The first reference voltage VREF1 output is the voltage multiplier output. It may have noise generated by the clock present and therefore may include a series resistor RREF1 (as shown in FIG. 5A, which may be >10 kO) in some cases to filter the signal and reduce noise. The second reference voltage VREF2 output is used when it is desired to output the ground voltage GND or the battery voltage VDD. Series resistance on the second reference voltage VREF2 would be undesirable when the output is connected to the ground voltage GND as it would create a high impedance path to ground and it is desired to have a low impedance connection to ground when the reference voltage generator circuit 26 is disabled.

A first reference shorting transistor TRS1, a second reference shorting transistor TRS2, a third reference shorting transistor TRS3, and a fourth reference shorting transistor TRS4 are used to disconnect the first reference voltage VREF1 output. A fifth reference shorting transistor TRS5 is used to short the second reference voltage VREF2 output to the battery voltage VDD, and a sixth reference shorting transistor TRS6 is used to short the second reference voltage VREF2 output to the ground voltage GND. The sixth reference shorting transistor TRS6 is driven by a grounding circuit 50. A seventh reference shorting transistor TRS7 biases the gate of the fifth reference shorting transistor TRS5.

FIG. 8 is a graphical representation of operation of the switch circuit 20 of FIGS. 5A and 5B. In the example illustrated, the input voltage VIN is a 1 megahertz (MHz) signal with a 5 V amplitude from 0 V to 5 V. The gate voltage VGATE of the switch transistor 22 settles to a constant 5.13 V above the 1 MHz input voltage VIN signal when the switch transistor 22 is closed. When the switch transistor 22 is open, the gate voltage VGATE is held at 0 V and the 1 MHz input voltage VIN signal does not propagate to the output port OUT. The switch circuit 20 (e.g., the switch driver 24) is driven by a 4 MHz "fast start" clock (CLK1) to ensure the output is settled to an acceptable voltage (e.g., a settling threshold) to close the switch in a few microseconds (µs). The frequency of the clock (CLK1) at startup or in steady state can be variable and suited to meet settling time or any clock frequency and spurious requirements of the overall switch circuit 20.

Those skilled in the art will recognize improvements and modifications to the preferred embodiments of the present disclosure. All such improvements and modifications are considered within the scope of the concepts disclosed herein and the claims that follow.

What is claimed is:

1. A switch circuit, comprising:
   a switch transistor having a source coupled to a variable voltage input port and a drain coupled to an output port; and
   a switch driver coupled to the variable voltage input port and coupled to a gate of the switch transistor, the switch driver configured to:
   in an enabled state, close the switch transistor and maintain a gate to source voltage of the switch transistor equal to or above a target voltage; and
   in a disabled state, maintain the switch transistor open;
   wherein the switch driver is driven by a variable frequency clock which operates at a higher frequency while the switch driver closes the switch transistor.

2. The switch circuit of claim 1, further comprising a reference voltage generator circuit coupled to the switch driver and configured to provide a reference voltage to the switch driver;
   wherein the target voltage is based on the reference voltage.

3. The switch circuit of claim 2, wherein:
   in the enabled state, the switch driver is configured to output a gate voltage equal to at least a sum of the target voltage and an input voltage of the variable voltage input port; and
   in the disabled state, the switch driver is configured to output the gate voltage equal to a ground voltage.

4. The switch circuit of claim 2, wherein the reference voltage generator circuit comprises a charge pump coupled to a battery voltage such that the reference voltage remains greater than the target voltage over changes in the battery voltage.

5. The switch circuit of claim 1, further comprising a body bias circuit coupled to a body terminal of the switch transistor and configured to maintain a gate to body voltage below a safety threshold.

6. The switch circuit of claim 5, wherein:
   in the disabled state, the body bias circuit sets the body terminal to a ground voltage;
   in the enabled state, the body bias circuit sets the body terminal proportional to an output voltage of the output port.

7. The switch circuit of claim 1, wherein the switch transistor comprises an N-type field effect transistor (NFET).

8. The switch circuit of claim 1, wherein the switch driver is configured to maintain the gate to source voltage greater than or equal to 4 volts (V) when in the enabled state.

9. The switch circuit of claim 8, further comprising a reference voltage generator circuit coupled to the switch driver and configured to provide a reference voltage greater than or equal to 4 V to the switch driver.

10. The switch circuit of claim 1, wherein the switch transistor is configured to selectively couple power management circuitry to a power amplifier.

11. The switch circuit of claim 1, wherein the switch transistor is configured to receive a modulated radio frequency (RF) signal at the variable voltage input port.

12. A radio frequency (RF) circuit, comprising:
   a switch transistor comprising a source terminal, a drain terminal, and a gate terminal;
   an input port coupled to the source terminal and configured to receive a variable voltage signal;
   an output port coupled to the drain terminal;
   a reference voltage generator circuit comprising a low dropout circuit configured to provide a reference voltage independent of a battery voltage; and
   a switch driver coupled to the reference voltage generator circuit and the input port and configured to:
   in an enabled state, enable the switch transistor by providing a gate voltage to the gate terminal based on the reference voltage and the variable voltage signal; and
   in a disabled state, disable the switch transistor.

13. The RF circuit of claim 12, wherein in the enabled state the switch transistor maintains a resistance below a threshold value across a voltage range of the variable voltage signal.

14. The RF circuit of claim 13, wherein the threshold value is 100 milliohms (me), and the voltage range is up to 5.5 volts (V).

15. The RF circuit of claim 12, wherein the switch driver comprises a signal dependent voltage multiplier circuit driven by a clock.

16. The RF circuit of claim 15, wherein the signal dependent voltage multiplier circuit outputs a sum of the reference voltage and the variable voltage signal.

17. The RF circuit of claim 12, wherein the switch driver comprises a reference voltage transistor configured to disconnect the switch driver from the reference voltage.

18. The RF circuit of claim 12, wherein the reference voltage generator circuit further comprises a voltage doubler circuit coupled to the low dropout circuit.

19. The RF circuit of claim 12, wherein the reference voltage generator circuit is further configured to output a second reference voltage when the switch driver is in the disabled state.

20. The A radio frequency (RF) circuit of claim 15, wherein comprising:
   a switch transistor comprising a source terminal, a drain terminal, and a gate terminal;
   an input port coupled to the source terminal and configured to receive a variable voltage signal;
   an output port coupled to the drain terminal;
   a reference voltage generator circuit configured to provide a reference voltage; and
   a switch driver comprising a signal dependent voltage multiplier circuit driven by a variable frequency clock and coupled to the reference voltage generator circuit and the input port;
   wherein the switch driver is configured to:
      in an enabled state, enable the switch transistor by providing a gate voltage to the gate terminal based on the reference voltage and the variable voltage signal;
      in the enabled state, operate the variable frequency clock at a higher frequency until the gate voltage reaches a settling threshold; and
      in a disabled state, disable the switch transistor.

* * * * *

UNITED STATES PATENT AND TRADEMARK OFFICE
CERTIFICATE OF CORRECTION

PATENT NO. : 10,790,817 B2  
APPLICATION NO. : 16/409294  
DATED : September 29, 2020  
INVENTOR(S) : Michael J. Murphy et al.

It is certified that error appears in the above-identified patent and that said Letters Patent is hereby corrected as shown below:

In the Specification

Column 4, Line 52, replace "(ms))" with --(mΩ)--.  
Column 4, Line 55, replace "50 ms)" with --50 mΩ--.  
Column 6, Line 66, replace "SW=VREF" with --SW1X=VREF--.  
Column 9, Line 15, replace "kO" with --kΩ--.

In the Claims

Claim 14, Column 11, Line 6, replace "(me)" with --(mΩ)--.  
Claim 20, Column 12, Lines 1-2, replace "The A radio frequency (RF) circuit of claim 15, wherein comprising:" with --A radio frequency (RF) circuit, comprising:--.

Signed and Sealed this  
Fifteenth Day of December, 2020

Andrei Iancu  
*Director of the United States Patent and Trademark Office*